United States Patent
Lee et al.

(10) Patent No.: US 7,064,432 B2
(45) Date of Patent: Jun. 20, 2006

(54) METHOD AND SYSTEM FOR BONDING A SEMICONDUCTOR CHIP ONTO A CARRIER USING MICRO-PINS

(75) Inventors: Sangmin Lee, Rancho Palos Verdes, CA (US); Michael Gurvitch, Stony Brook, NY (US); Serge Luryi, Setauket, NY (US)

(73) Assignee: The Research Foundation of State University of New York, Stony Brook, NY (US)

( * ) Notice: Subject to any disclaimer, the term of this patent is extended or adjusted under 35 U.S.C. 154(b) by 208 days.

(21) Appl. No.: 10/333,199

(22) PCT Filed: Jul. 26, 2001

(86) PCT No.: PCT/US01/23572

§ 371 (c)(1),
(2), (4) Date: Sep. 2, 2003

(87) PCT Pub. No.: WO02/09194

PCT Pub. Date: Jan. 31, 2002

(65) Prior Publication Data

US 2004/0038496 A1 Feb. 26, 2004

Related U.S. Application Data

(60) Provisional application No. 60/220,709, filed on Jul. 26, 2000.

(51) Int. Cl.
*H01L 23/48* (2006.01)

(52) U.S. Cl. .................................. 257/737; 438/613
(58) Field of Classification Search ........ 438/613–617; 257/737, 738
See application file for complete search history.

(56) References Cited

U.S. PATENT DOCUMENTS

| 5,468,681 | A |    | 11/1995 | Pasch |
|-----------|---|----|---------|-------|
| 5,509,815 | A |    | 4/1996  | Jin et al. |
| 5,637,535 | A |    | 6/1997  | Matsuda et al. |
| 5,819,406 | A | *  | 10/1998 | Yoshizawa et al. ........... 29/877 |
| 5,971,253 | A |    | 10/1999 | Gilleo et al. |
| 6,206,272 | B1 |   | 3/2001  | Waldron-Floyde et al. |
| 6,255,136 | B1 |   | 7/2001  | Alcoe et al. |

FOREIGN PATENT DOCUMENTS

| JP | 1-128590  | 5/1989 |
| JP | 3-218030  | 9/1991 |

* cited by examiner

*Primary Examiner*—David Vu
(74) *Attorney, Agent, or Firm*—Baker Botts L.L.P.

(57) ABSTRACT

An anisotropically conductive layer "ACL" (50) for mechanical and electrical bonding of two circuit containing structures, such as a flip chip and carrier is disclosed. The ACL is formed of a rigid insulating substrate (72) or membrane (61) with a top and bottom planar surfaces formed with a plurality of pins therein. The pins extend beyond the top and bottom surfaces so that a portion of each pin is exposed. The pins provide electrical connection between contact terminals or pads of the flip chip and carrier and additionally provide mechanical support between the flip chip and carrier so that the flip chip can under go post-bonding processing without substantial deformation or breaking. A method of electrically and mechanically bonding the flip chip and carrier and a method of making a semiconductor device using the ACL is also disclosed.

16 Claims, 11 Drawing Sheets

METHOD AND SYSTEM FOR BONDING A SEMICONDUCTOR CHIP ONTO A CARRIER USING MICRO-PINS

RELATED APPLICATIONS

This application claims priority from U.S. Provisional application 60/220,709 filed Jul. 26, 2000, which is herein incorporated by reference.

BACKGROUND OF INVENTION

The invention relates to the field of semiconductor circuits and devices packaging generally, and in particular, Active Packaging of the type described in U.S. Pat. No. 5,496,743 incorporated herein by reference. Active Packaging relates to the bonding of a flip chip onto a carrier. For this purpose, a carrier is any electronic circuit containing structure, such as a wafer, a plate, a printed circuit board or another chip and a flip chip is a circuit containing structure that undergoes partial processing on one side, is then flipped and further processing is performed on the other side of the chip. In Active Packaging, the partially processed flip chip is bonded onto the carrier before processing of the integrated circuit chip is complete. Thus, in a typical scenario, a semiconductor flip chip is partially processed on one side, bonded onto a carrier such that electrical and mechanical connections between the flip chip and carrier are accomplished, then final processing on the other side of the flip chip occurs. Final processing can include lithography, etching, layer deposition, doping, thinning and other processing steps well known to one of ordinary skill in the art. This technique is often used as a preferred alternative to wire bonding two separate circuit containing parts.

Several methods other than wire bonding are known for bonding an integrated circuit chip onto a carrier. One technique previously utilized was Z-axis conductive film adhesives. A typical example of this technique is illustrated in FIG. 1. There, flip chip 11, and carrier 15 are electrically and mechanically connected using a Z-axis conductive film adhesive which consists of conductive particles 13 with diameter of 5–100 μm (microns) contained in an adhesive resin 14. The resin 14, mechanically holds the carrier wafer 15 to the flip chip 11 and also insulates the conductive particles 13 from one another Conductive particles 13 mechanically interface with contact pads 12 on the flip chip 11 and carrier 15, thereby ensuring electrical connection between respective contact pads 12 of the flip chip 11 and those of the carrier 15.

This technique suffers from the disadvantage that the number of conductive particles per contact pad is not large, which dictates that large forces will have to be applied between flip chip 11 and carrier 15 in order to ensure sufficient electrical contact between the respective contact pads 12. This relatively large force creates substantial stress on the flip chip after bonding, which makes the technique unsuitable for the brittle and/or thin flip chips that are used in Active Packaging. Additionally, the differences in thermal expansion coefficients of a thin flip chip and the adhesive resin or epoxy create further mechanical stresses during thermal cycling. Further, in today's high density integrated circuits, the electrical contact pads are so closely spaced that the conductive particles may be too large to ensure the contact pads are electrically isolated from each other. Finally, the need for an adhesive such as an epoxy or resin to provide mechanical bonding between the flip chip and the carrier creates problems when the back of the flip chip must remain free from contamination so post-bonding processing may occur.

Another bonding technique known in the art is solder ball and epoxy encapsulation. This technique is illustrated in FIG. 2A. In this method solder balls 23 are bonded on electrical contact pads 22 of a carrier 25, and the contact pads 22 of the flip chip 21 are aligned with and soldered to respective ones of the solder balls 23. The size of the solder ball is typically between 50 and 150 microns. Epoxy resin 24 is applied after soldering to make a stable bonded structure. This method of epoxy encapsulation suffers from the same disadvantages as the Z-axis adhesive film technique previously described.

In an effort to overcome the problems of contaminating the flip chip with epoxy or other resin, a revised solder ball epoxy bonding technique has been proposed, as illustrated in FIG. 2B. In this revised technique, the adhesive layer 33 is pre-formed on the carrier 15. Moreover, the solder balls 31 are first soldered to the contact pads 14 of the flip chip 11. The solder balls 31 are formed with a pointed end so that they may penetrate the adhesive layer 33 during the mounting process when pressure is applied between the flip chip 11 and the carrier 15. The pointed solder balls are pressure bonded to respective electrodes 32 of the chip carrier 15 without the adhesive film coming into contact with the flip chip 11. Although this technique overcomes the problem of contamination of the flip chip by the adhesive material, it still suffers from the other defects previously mentioned, including the presence of large mechanical stresses on the flip chip after bonding.

A revised approach has been proposed to overcome some of the limitations associated with prior bonding techniques. This approach, illustrated in FIG. 3, utilizes a Z-axis oriented multiple metal fibrils or tubules 16 embedded in a soft porous membrane 17, such as liquid crystal or a polymer. This technique is described in detail in U.S. Pat. Nos. 5,805,424, 5,805,425, 5,805,426 and 5,818,700, which are incorporated herein by reference. According to this technique, the diameter of the metal fibrils 16 and the distance between adjacent fibrils in the membrane is much smaller than the typical spacing between adjacent contact pads 18 on the flip chip 11 and the carrier 15, and the typical contact pad size. In this manner, many metal fibrils are in electrical contact with each contact pad 18 on the flip chip 11 and carrier 15 so that the electrical contact resistance between opposing contact pads 18 is much smaller than in the conventional Z-axis conductive film techniques. Bonding between the flip chip 11 and carrier 15 is achieved by applying pressure to the thermo-compressible material.

SUMMARY OF THE INVENTION

It is an object of the present invention to provide an improved method and system for electrical and mechanical bonding of two circuit containing elements such as a chip carrier and flip chip. This advantage is achieved by the use of an anisotropically conductive bonding interface (referred to herein as an anisotropically conductive layer) which is composed of a rigid insulating substrate or membrane with top and bottom planar surfaces. A plurality of conductive rigid pins are embedded in the substrate, and each pin extends beyond the top and bottom planar surfaces, forming what might appear to be a "bed of nails". This arrangement provides for electrical conductivity through the pins in the direction normal to the planar surfaces, but not in other directions, since the pins are electrically isolated from one another. The pins are arranged so that when the anisotropically conductive layer is placed between two circuit containing structures, the electrical contact pads on each structure are contacted by a plurality of the pins. When the two circuit containing structures are bonded to one another, a plurality of pins will connect one contact pad on the first circuit containing structure to an associated contact pad on the other circuit containing structure. Moreover, those pins extending beyond the planar surfaces of the conductive layer's insulating substrate that are not involved in the electrical connection of respective electrical contact pads of the two circuit containing structures act to provide mechanical support to one or both of the circuit containing structures.

In an exemplary embodiment, the diameter of the portion of the pins that extends beyond the planar surfaces of the insulating substrate is substantially the same as the diameter of the portion of the pins inside the substrate.

In another exemplary embodiment, the diameter of the portion of the pins that extends beyond the planar surfaces of the insulating substrate may be enlarged compared to the diameter of the portion of the pins inside the substrate.

In a further preferred embodiment, the diameter of the pins providing mechanical, but not electrical contact are larger than the diameter of the pins providing electrical connection between contact pads.

In another preferred embodiment, the nominal diameter of the pins is between 0.01 microns and 0.4 microns.

In another exemplary embodiment, the pins protrude from the planar surfaces of the insulating substrate by an amount substantially equal to the distance the electrical contact pads protrude from the circuit containing structure (i.e. the pad thickness).

In another exemplary embodiment, the pins protrude from the planar surfaces of the insulating substrate by an amount that is substantially the same as the distance between pins.

In yet another exemplary embodiment, the pins are substantially evenly distributed throughout the insulating substrate with an average distance between neighboring pins. This distance may be equal to or less than the thickness of the flip chip (which is bound to a carrier by the anisotropically conductive layer) after final processing.

In a still further exemplary embodiment, the distance between the two planar surfaces of the insulating substrate is between 5 and 25 microns, and the substrate may be formed from SiC, SiNx, SiO$_2$, mica, polycarbonate or alumina (aluminum oxide), which may be formed by anodization of high purity (i.e. over 99.9% pure) aluminum foil.

In another exemplary embodiment, the anisotropic conducting layer is bonded onto the circuit containing structures by soldering some of the pins onto the electrical contact pads of the circuit containing structure. In a further exemplary embodiment, the anisotropic conducting layer is bonded onto the circuit containing structures by physically penetrating some of the pins into the electrical contact pads of the circuit containing structure by respective pins making electrical contact to the pads and without soldering. For this purpose, it may be advantageous to form the contact pads from a material that is softer than the material from which the pins are formed. For example, if the pins were formed of copper, the contact pads may be formed from Sn, Pb, In or alloys thereof.

In a still further exemplary embodiment, a soft insulating material is applied either to the whole surface of one of the circuit containing structures (including the contact pads), or to those portions of the circuit containing structure that are not electrical contact pads. The anisotropic conducting layer is then bonded onto the circuit containing structure by penetrating respective pins into the electrical contact pads and the soft insulating material.

In a final exemplary embodiment, a semiconductor device, such as a high-speed heterojunction bipolar transistor is manufactured by performing a series of processing steps on a semiconductor substrate to partially fabricate a semiconductor device, bonding the partially-fabricated semiconductor substrate to a carrier chip in a flip chip fashion using an anisotropic conducting layer of the type previously described, and performing a series of final processing steps on the bonded partially-fabricated semiconductor device.

DETAILED DESCRIPTION OF EXEMPLARY EMBODIMENTS

Figure 1:
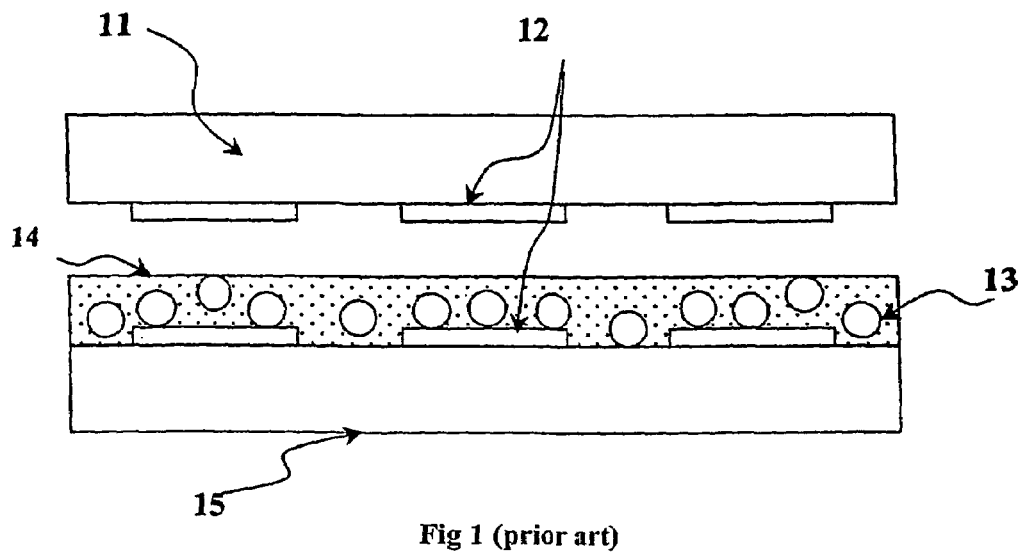
FIG. 1 shows the cross-sectional view of a prior art technique for bonding a chip onto a carrier using conductive particles and an adhesive resin
Figure 2A:
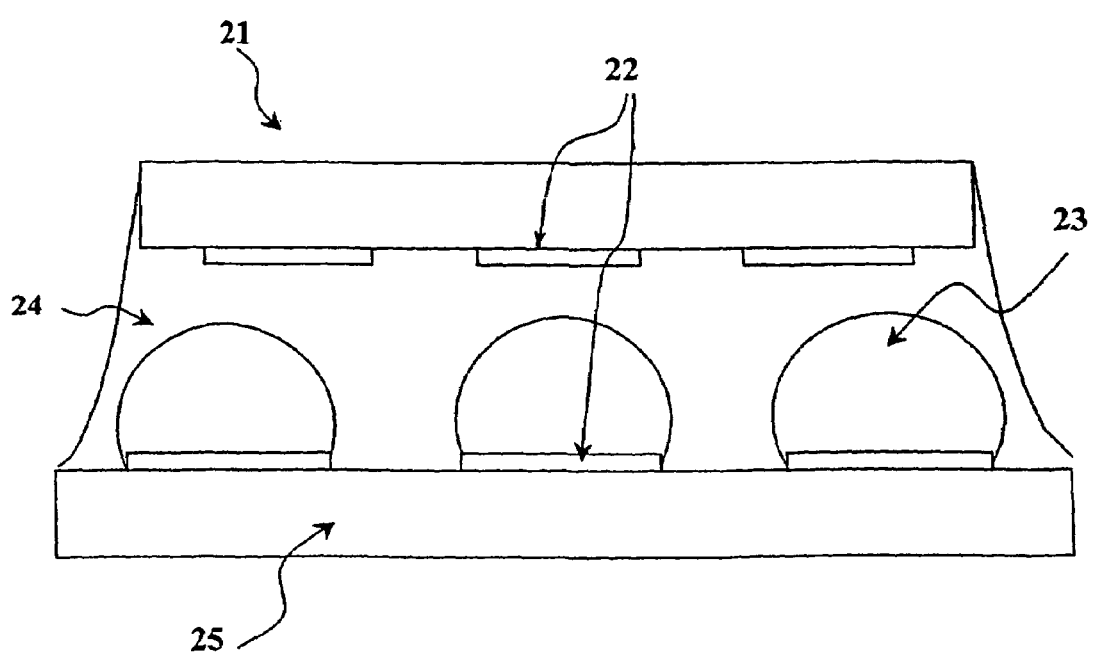
FIG. 2A shows the cross-sectional view of a prior art technique for bonding a chip onto a carrier using solder balls and an epoxy.
Figure 2B:
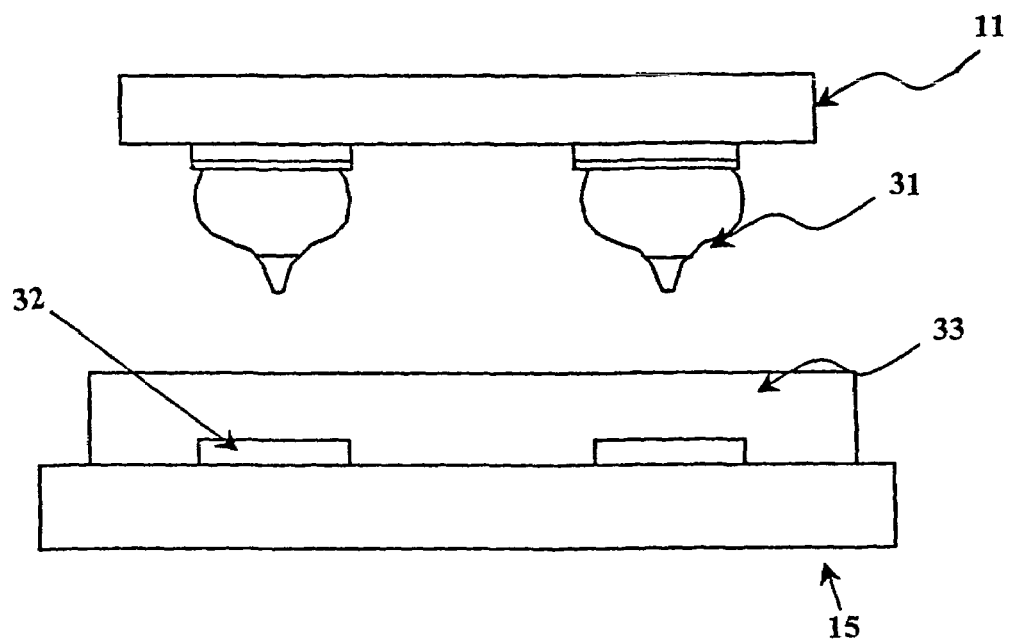
FIG. 2B shows the cross-sectional view of a modified version of the technique illustrated in FIG. 2A.
Figure 3:
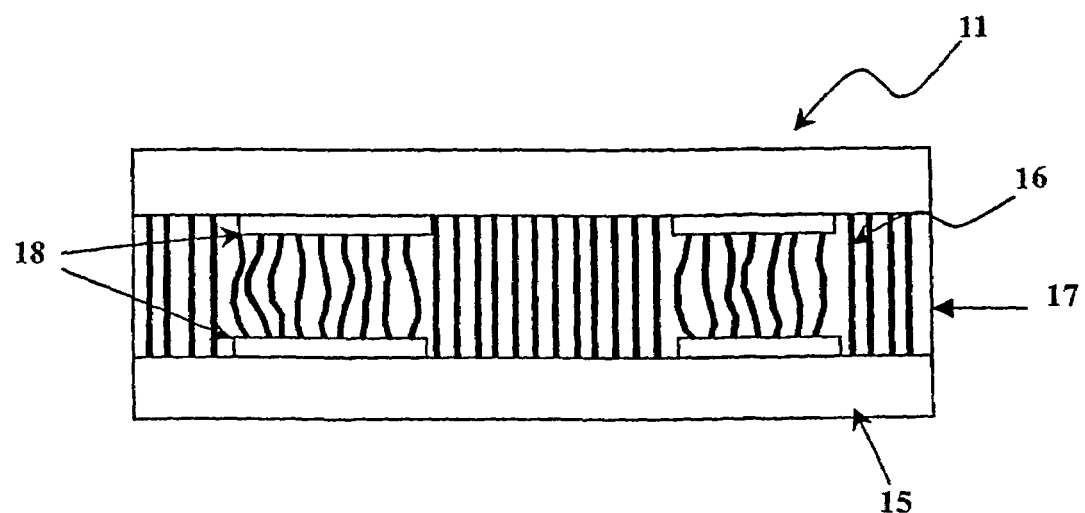
FIG. 3 shows the cross-sectional view of a prior art technique for bonding a flip chip to a carrier using a soft Z-axis conductive film with embedded conductive tubules.

Referring to FIGS. 4A–4F, the steps involved in an exemplary method of forming an anisotropically conductive layer 50 of the present invention are illustrated. The illustrated steps involve the use of the nuclear track-etch method, which is well known to one of ordinary skill in the art. The pin diameter 58, or pin hole diameter 57, obtained by this method can range from 0.01 microns to a few tens of microns. The distribution of hole diameters is sharp, with deviations from the rated diameter of typically less than 20%. Preferably, the hole diameters range from 0.01 micron to about 0.5 micron. Porous membranes prepared by this method can be purchased commercially, or prepared as described below. The commercial product can be obtained from Corning (Nuclepore membranes) or from Osmonics (Poretics Policarbonate Track-Etch (PCTE) membranes). If a commercial product is employed, pins must be formed in the porous material using, for example, the electroplating technique discussed herein.

The process begins with a three membrane layers 51, 52, 53. In the exemplary embodiment, the layers consist of 10 microns of mica 52, sandwiched between two layers of 2.5 micron thick polycarbonate 51, 53. The thickness of the outer layers 51, 53 are preferably proportional to the diameter of the pin holes formed using this method, with smaller diameter pins corresponding to thinner outer layers 51, 53, so as to maintain mechanical rigidity of the anisotropically conductive layer. Outer layers 51, 53 should be capable of being removed, such as by a selective etch method, without damaging the integrity of the middle substrate layer 52 or the pins 58.

Vertically oriented tracks 56 are then formed in the three layer membrane by bombarding the membrane with charged accelerated nuclear fission particles from a radioactive source, such as radioactive Californium or by placing the membrane into a nuclear reactor. The number of tracks per unit area depends primarily on the exposure time and the flux of energetic nuclear particles. By varying these parameters, it is possible to control the average density of resulting tracks. Once the energized particles have created randomly distributed tracks 56 with sufficient density (although the tracks are shown with regular spacing in FIG. 4B-4C, in practice the spacing between tracks 56 will vary), which constitute normally-oriented damaged regions in the membrane layers 51, 52, 53, the membrane layers are exposed to an anisotropic etchant such that the etch rate for damaged regions is faster than the etch rate for undamaged regions. In the exemplary embodiment, two or three etch and rinse steps are employed using two different etchants, the different steps corresponding to the outer and inner layers of the three membrane layers 51, 52, 53. In this manner, holes are formed along each of the tracks extending completely through the membrane layers 51, 52, 53. For example, the tracks in outer polycarbonate layers 51, 53 may be etched with NaOH, which does not substantially etch the mica layer 52. The nuclear tracks in the mica layer 52 (which is mainly composed of $SiO_2$) may be etched with a solution of hydrofluoric acid HF.

Once holes have been formed in the three membrane layers 51, 52, 53 one of the outside layers 53 is coated with metal layer 54. The metal layer, in turn, is mounted on conductive substrate 55. Any metal with good conductance, such as copper or gold, will suffice for the conductive substrate 55. Alternatively, the conductive substrate 55 can be made of a soft metal, such as Indium, and the three layer membrane can be pressed against that metal. In this case it may be unnecessary to cover the outer membrane layer 53 with metal layer 54.

Figure 4A:
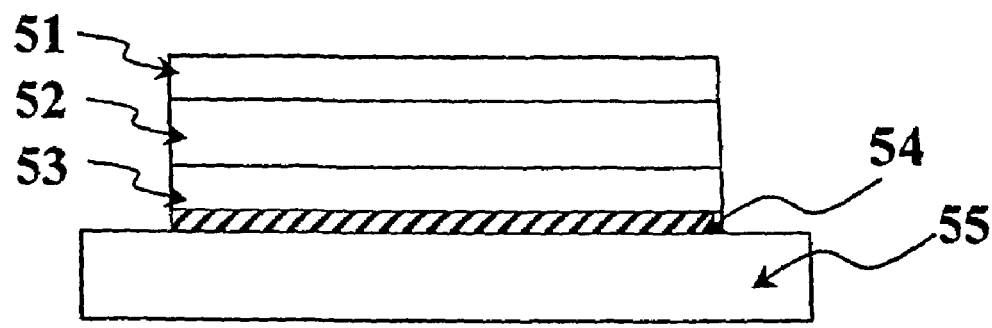
FIGS. 4A–4F show the cross-sectional view of an exemplary technique for forming an anisotropically conductive layer in accordance with the present invention.
Figure 4B:
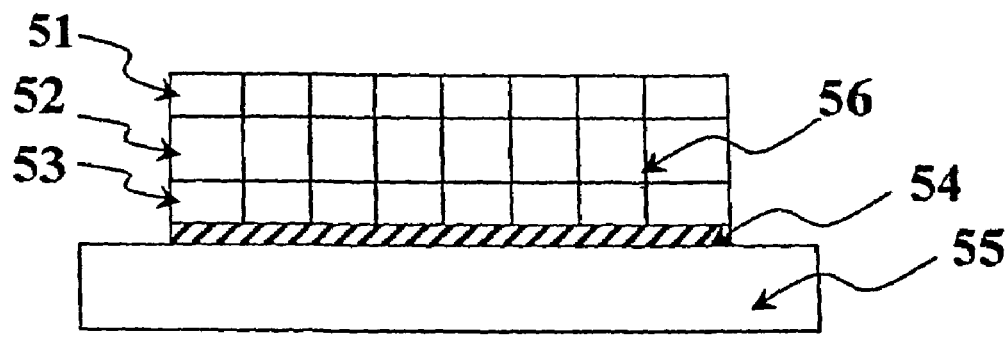
Figure 4C:
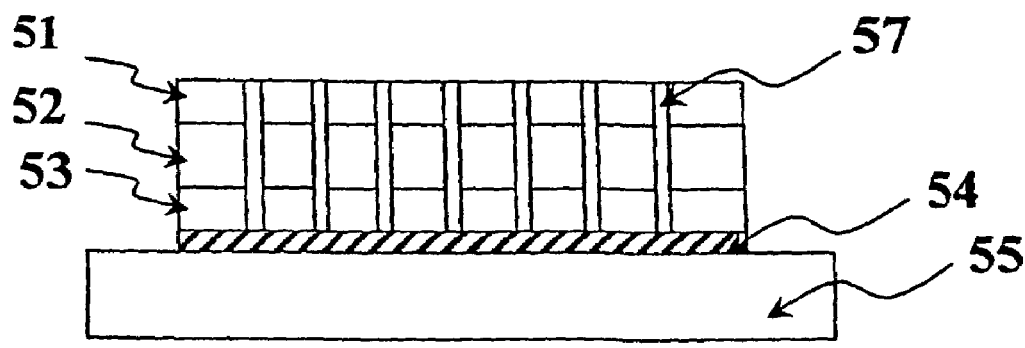
Figure 4D:
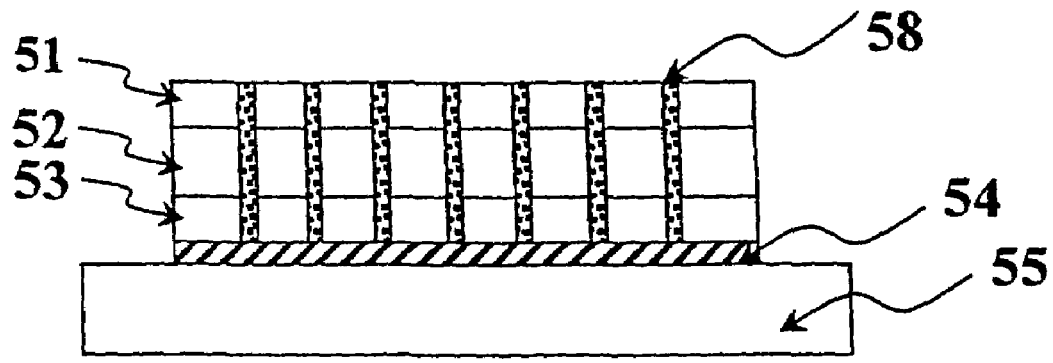

In FIG. 4D, metal pins 58 are formed in the previously formed holes 57 using traditional electroplating of the metal layer 54 in each of the holes 57. The metal chosen should have a melting temperature higher than the relevant soldering temperature, such as 500° C. so the pins 58 will maintain their shape during any subsequent soldering. Moreover, the metal should be sufficiently hard so as to not deform during the bonding of a flip chip onto a carrier. In the preferred embodiment, copper is chosen for the metal pins 58.

After pin formation, the membrane layers 51, 52, 53 and pins 58 are demounted from backside metal 54 and substrate 55. This can be achieved by mechanically separating the membrane from the substrate 55, using, for example, a sharp blade. The connection between the substrate 55 and the membrane 51, 52, 53 is typically not strong, as the mechanical connection consists primarily of the pin cross-sections that were grown from the metal substrate 55 up into the hole 57.

Figure 4E:
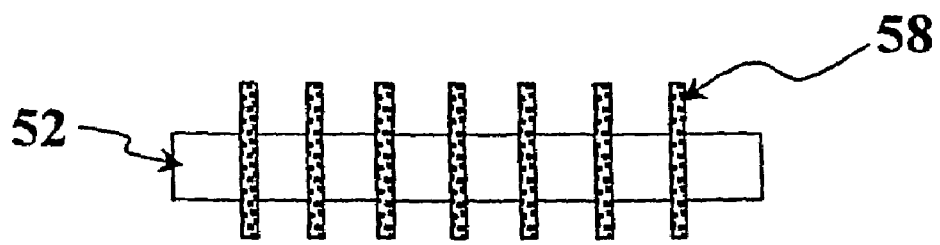
Figure 4F:
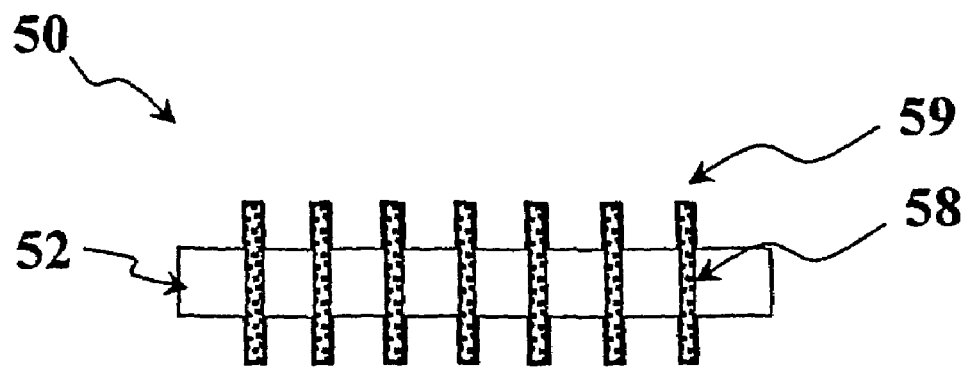

After the demounting step, the top and bottom membrane layers 51, 53 are removed by an etchant that selectively removes polycarbonate layers 51 and 53, while leaving the middle layer 52 and metal pins 58 intact, resulting in the anisotropically conductive layer shown in FIG. 4E. An alkaline solution of NaOH may be used for this purpose. As shown in FIG. 4F, an optional further step of electroplating (such as electroless plating), can be conducted to make the diameter of the exposed portion 59 of each of the metal pins 58 larger than the unexposed portion, thus preventing the metal pins from becoming movable in the vertical direction in the rigid insulating membrane, also referred to as substrate 52. The resulting anisotropically conductive layer 50, may then be used to electrically and mechanically bond two circuit containing structures.

In a similar exemplary embodiment (not shown), a single material membrane may be used, for example a polycarbonate layer a few microns thick. The process proceeds much like the three-layer technique described, i.e. formation of nuclear track-generated holes and filling of these holes with metal by electroplating. At the end of this process, the outer portions of each pin are exposed by partial etching of the membrane in a chemical that removes the membrane material but does not damage the pin material. An alkaline solution of NaOH is suitable for this purpose.

The pins 58 of the anisotropically conductive layer 50 must, on average, be spaced sufficiently close so as to keep the circuit containing structure, such as the flip chip, that they support from deforming caused by mechanical forces exerted on the chip by the pins 58. For example, a flip chip may encounter mechanical forces during bonding with another circuit containing substrate such as a carrier wafer or chip, or during subsequent processing steps such as thinning. The forces encountered by the flip chip may be approximated by traditional stress and strain equations well known to one of ordinary skill in the art and are more easily understood with reference to a thin square plate with side lengths L (corresponding to the average distance between pins) and thickness t. If the plate is supported only at its four corners and a pressure P is applied to the plate, the maximum deformation (i.e. bending of the plate) is:

$$B_{max} = -\alpha \frac{PL^4}{Et^3},$$ (Eq. 1)

where a is a geometrical factor (0.0444 for a square plate) and E is Young's modulus of elasticity (131 GPa in the <100> direction for silicon).

Using the formula in Eq. 1, it can be shown that for a pressures P of approximately 10 atm (or $10^6$ Pa, which is larger than the pressures encountered during most processing operations such as bonding and thinning), a plate thickness t of five microns, and plate length L of one micron, the maximum deformation of the plate is approximately $3\times10^{-9}$ microns, which is negligible and should not result in fracturing of the plate. Similarly, assuming the material to be a polyamide (a material typically used to form an insulation layer in semiconductor devices) rather than silicon, the maximum deformation increases to the order of $10^{-4}$ microns, which again is negligible and should not result in fracturing of the plate. However, if the length L is increased to ten microns, the maximum deformation increases to approximately 0.35 microns and 3.5 microns for Silicon and polyamide respectively, which is sufficient to fracture the plate. Consequently, to ensure the flip chip does not fracture, the distance L between unsupported portions of the flip chip should remain at approximately 1 micron or less. This implies that the distance between adjacent pins 58 in the anisotropically conductive layer 50 should be approximately 1 micron or less.

Notably, if the pin distance is 1 micron and the total chip size is approximately 1×1 mm², there will be approximately one million pins 58 supporting the chip. Accordingly, the 10 atm pressure P applied to the flip chip during processing will be spread over all the pins 58, resulting in a force of about $10^{-6}$ N on each pin, which is sufficiently small to prevent pin deformation, assuming a pin diameter of approximately 0.5 microns.

Referring now to FIGS. 5A–5E, an alternative approach to constructing an anisotropically conductive layer using an anodic alumina membrane is illustrated. The porous membranes can be either prepared as described below, or purchased from, for example, Fisher Scientific (Whatman Anodisc filter membranes with pore diameters from 0.02 micron to 0.2 micron). Porous oxide growth on very pure aluminum under anodic bias in various electrolytes has been well known in the art for a number of years. A description of the process appears in U.S. Pat. No. 6,045,677, incorporated herein by reference. Porous membranes formed in this matter are characterized by narrow vertical pores with sharp pore diameter distribution and overall uniformity of pores throughout the membrane surface. More recently it was found that for a narrow range of growth parameters, it is possible to obtain a self-organized densely packed hexagonal pore structure. See H. Masuda et al., Appl. Phys. Lett. vol. 71, p. 2270–72 (1997), incorporated herein by reference.

Figure 5A:
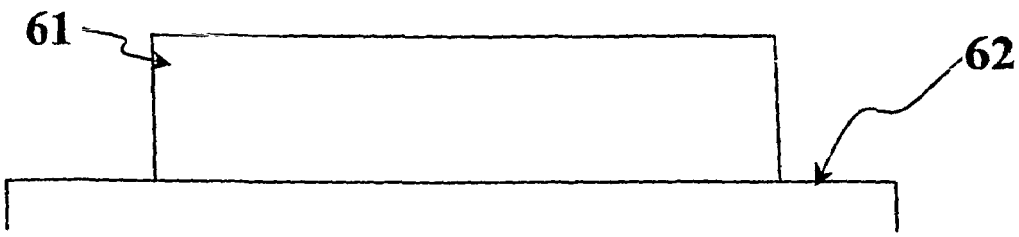
FIG. 5A-5E show the cross-sectional view of another exemplary technique for forming an anisotropically conductive layer in accordance with the present invention.
Figure 5B:
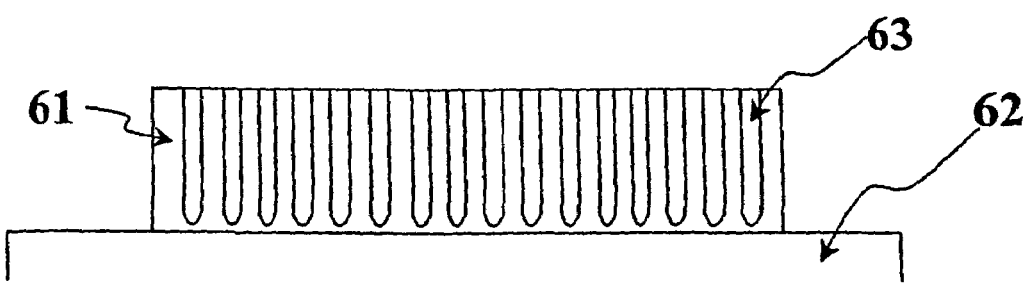
Figure 5C:
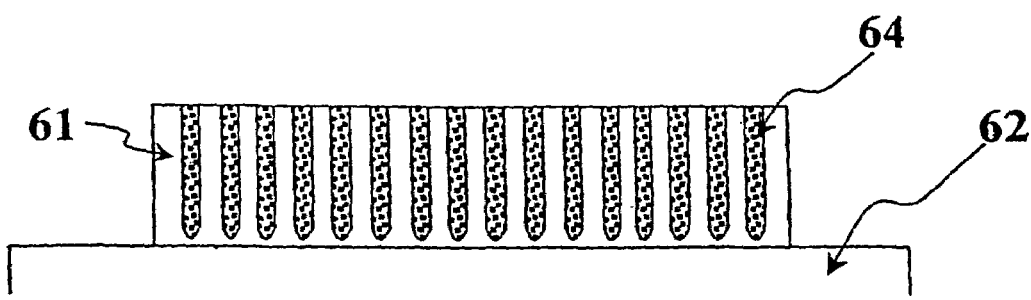
Figure 5D:
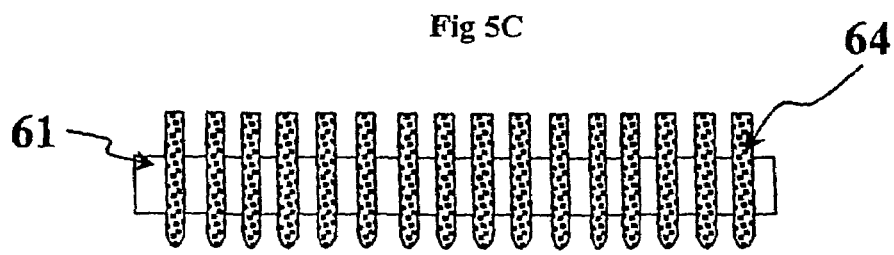

High purity aluminum foil 61 (more than 99.9% pure) with thickness of a few microns, is mounted on a conductive metal plate 62, such as a copper plate. Regularly distributed holes 63 are formed in the membrane 61 by slow anodization in 0.3 M oxalic acid solution, at 15–17 degrees C., under a constant voltage of 40 V, as described in H. Masuda and K. Fukuda, Science vol. 268, p.1466–68 (1995), incorporated herein by reference. The diameters of holes 63 can be further adjusted by dipping of the anodized porous membrane into various acidic solutions. Preferred acids include sulfuric, phosphoric and oxalic acids. Hole size using this technique can vary from 0.01 microns to 0.4 microns. Typically, a lower layer of the aluminum foil 61 remains in the metallic state, and the holes in the anodized alumina terminate without going all the way through, as shown in FIG. 5C. After anodization, the aluminum substrate and the bottom part of the porous layer can be etched away with saturated $HgCl_2$.

Holes 63 are then ready for filling with metal. In an exemplary embodiment, the holes 63 are filled with metal to make pins 64 using AC electroplating of the metal plate 62 in each of the holes 64, or using electroless electroplating, which are well known to one of ordinary skill in the art. See R. M. Metzger et. al., IEEE Trans. on Magnetics, vol. 36, p. 30 (2000). Both methods allow for filling the incomplete hole 63 with metal despite the fact that there is a thin partition of insulating alumina between the interior of the hole 63 and the metal substrate 62. Regular electroplating can be used if the bottom part of the membrane has been etched with $HgCl_2$ and the holes have been opened on both ends.

Figure 5E:
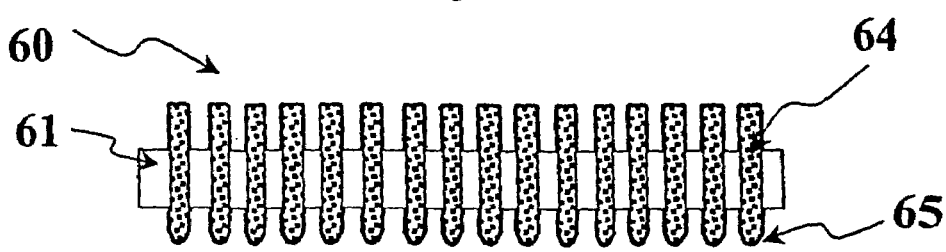

Once the pins 64 are formed, the membrane and pins are mechanically demounted from the conductive substrate 62. Etching in an appropriate acid or other chemical, such as saturated $HgCl_2$ which removes alumina but not the metal pins, is then performed to remove residual Aluminum from the membrane and to thin the alumina membrane so as to expose the top and bottom portions of the pins, resulting in the structure shown in FIG. 5D. Again, it is possible to use electroless or other standard plating techniques to increase the diameter of the exposed portions of the pins 64 as a final processing step. The resulting anisotropically conductive layer 60 is shown in FIG. 5E.

Figure 6A:
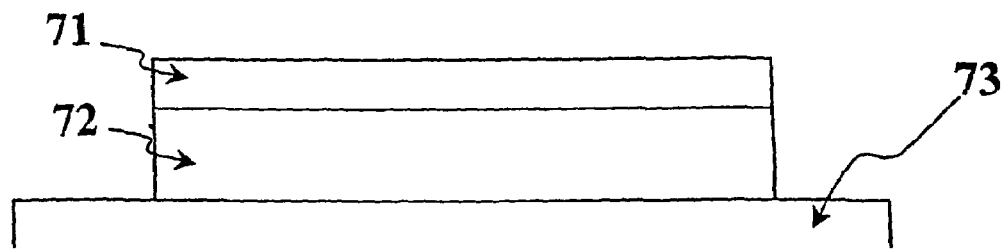
FIG. 6A-6F show the cross-sectional view of another exemplary technique for forming an anisotropically conductive layer in accordance with the present invention.
Figure 6B:
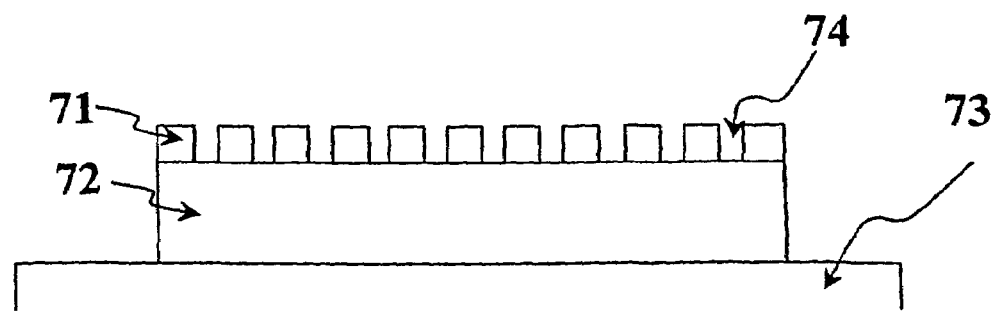
Figure 6C:
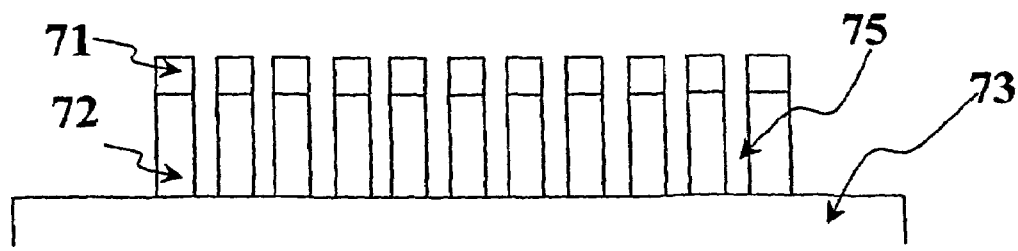
Figure 6D:
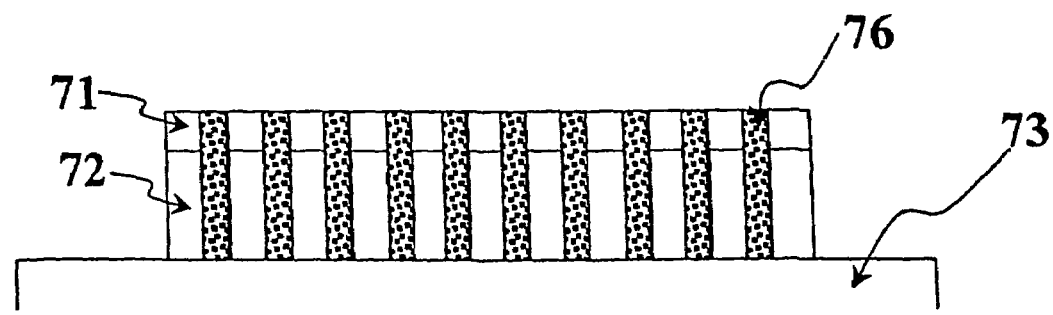
Figure 6E:
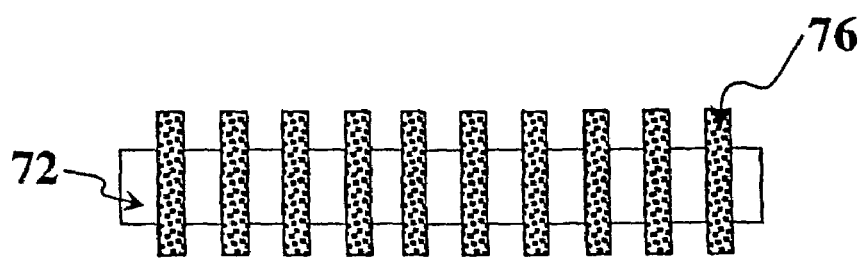
Figure 6F:
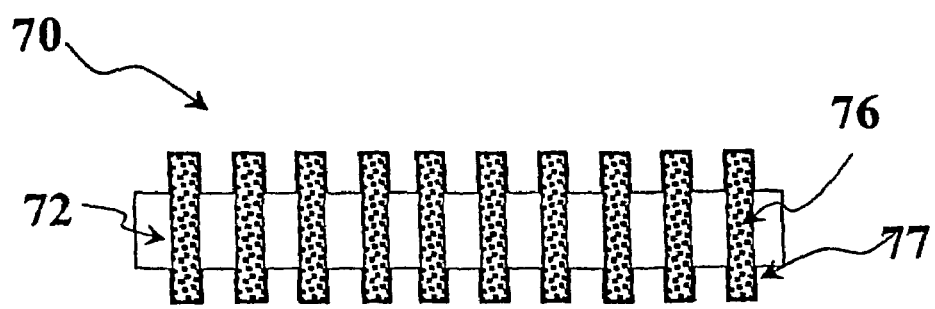

Referring now to FIGS. 6A–6F, a third approach to constructing an anisotropically conductive layer is presented using a traditional photolithography and etching technique. An approximately 40 to 100 micron thick insulating membrane 72, such as Silicon is formed on a conductive substrate 73. A photoresist layer 71 is applied to coat the top surface of the membrane 72 as illustrated in FIG. 6A. The insulating membrane 72 may be a carbon doped silicon material, mica, or quartz platelet. The photoresist may be any general negative photo resist such as AZ-5200, manufactured by AZ Electronic Materials of Somerville, N.J. The closely spaced hole array pattern 74 is then exposed in the photoresist using a suitable mask. To ensure the holes are spaced closely enough, it is preferred to employ optical lithography using UV light or electron beam lithography. After the exposed photoresist 71 is developed to form the photoresist pattern shown in FIG. 6B, the membrane 72 masked by the photoresist pattern is subjected to a highly anisotropic etchant, such as induction coupled plasma (ICP) etching. If membrane 72 is composed of $SiO_2$, the plasma may consist mainly of $CF_4$; if the membrane 72 is composed of SiC, it may consist mainly of $SF_6$. The ICP technique is known to produce high aspect ratio vertical holes 75 through the membrane, as shown in FIG. 6C. The holes 75 are filled with metal by electroplating the metal substrate 73 through the holes 75, as shown in FIG. 6D. The membrane with metal filled holes 76 is then demounted from substrate 73. The photoresist layer 71 is then removed and further etching takes place to expose the top and bottom portion of the pins 76, forming the structure shown in FIG. 6E. Electroless or regular electroplating may then be employed to increase the diameter of the exposed portion 77 of the pins 76, forming the anisotropically conductive layer 70, as shown in FIG. 6F.

Figure 7A:
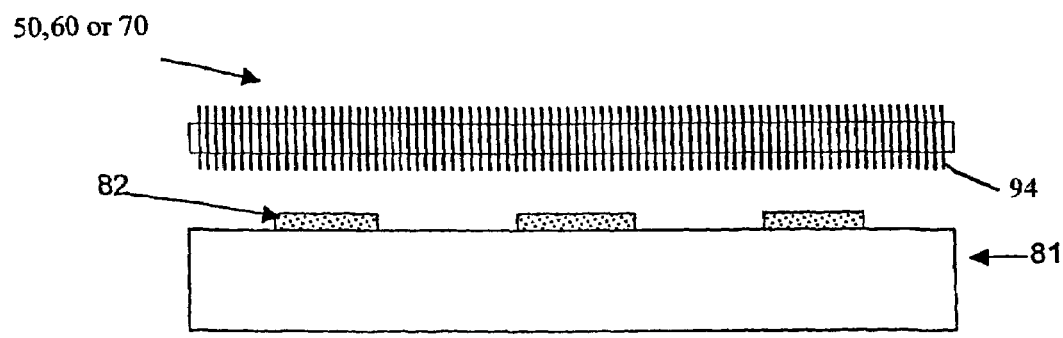
FIGS. 7A–7B show the cross-sectional view of an exemplary technique for bonding a circuit containing structure to an anisotropically conductive layer in accordance with the present invention.
Figure 7B:
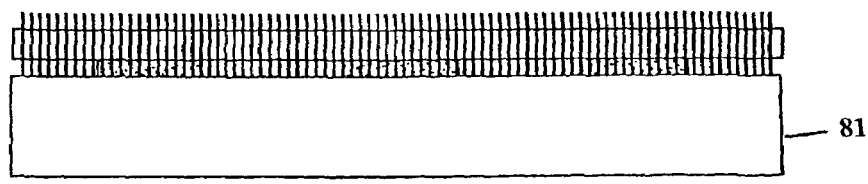

The anisotropically conductive layer of the present invention 50, 60, 70 may be used to electrically and mechanically bond two circuit containing structures, such as a flip chip and chip carrier. FIGS. 7A–7B illustrate an exemplary method of bonding an anisotropically conductive layer 50, 60, 70 to a circuit containing structure 81. The structure 81 has electrical contact pads 82, which protrude from its surface. The bonding of the anisotropically conductive layer 50, 60, 70 to the structure 81 is achieved by soldering respective pluralities of the metal pins 94 with the contact pads 82, or by mechanically penetrating the contact pads 82 with respective pluralities of the metal pins 94 of anisotropically conductive layer 50, 60, 70, as shown in FIG. 7A. The pins not soldered to or penetrating the contact pads 82, contact the surface of structure 81, providing mechanical support to the structure 81. Consequently, the length of the exposed portion of the pins in the anisotropically conductive layer 50, 60, 70 is comparable to or greater than the distance the electrical contact pads 82 extend from the surface of structure 81 (i.e. the pad thickness).

Figure 8A:
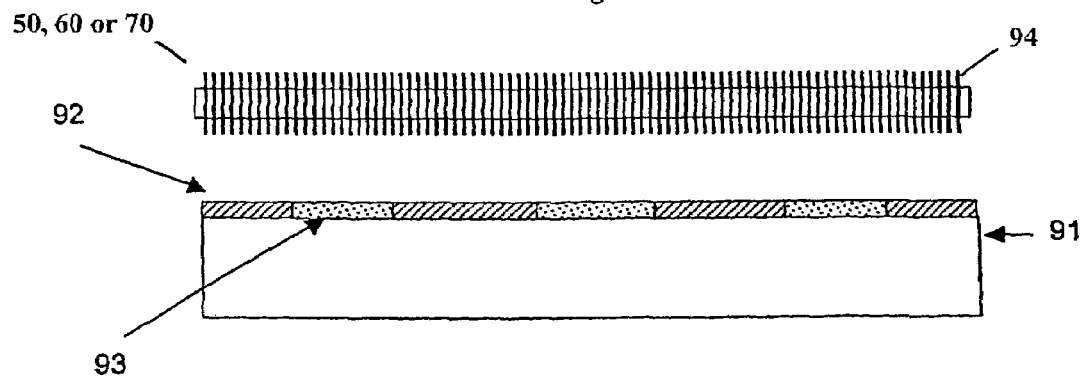
FIGS. 8A–8B show the cross-sectional view of another exemplary technique for bonding a circuit containing structure to an anisotropically conductive layer in accordance with the present invention.
Figure 8B:
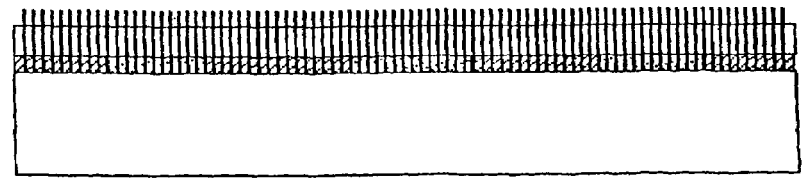

Referring now to FIGS. 8A–8B, another exemplary method of bonding the anisotropically conductive layer 50, 60, 70 onto circuit containing structure 91 is illustrated. In this embodiment, a soft insulating material is applied to coat the surface of structure 91, but not to coat the surface of electrical contact pads 93. The thickness of the soft insulating layer 92 should be approximately the same as the distance the electrical contact pads 93 protrude from the surface of structure 91. The bonding of the anisotropically conductive layer 50, 60, 70 to the structure 91 is achieved by soldering respective pluralities of the metal pins 94 to the contact pads 93, or by mechanically penetrating the contact pads 93 with the metal pins of anisotropically conductive layer 50, 60, 70. The pins not bonded to the electrical contact pads 93 penetrate the soft insulating material 92, forming mechanical bonds that help to distribute forces applied to the anisotropically conductive layer over the bonded surface of the structure 91. Alternatively, (although not shown in FIG. 8A), the soft insulating material may cover the entire surface of structure 91. In that case, the pins would penetrate the soft insulator material both to make electrical contact to the pads and to make mechanical contact to the rest of the surface of the structure.

Figure 9:
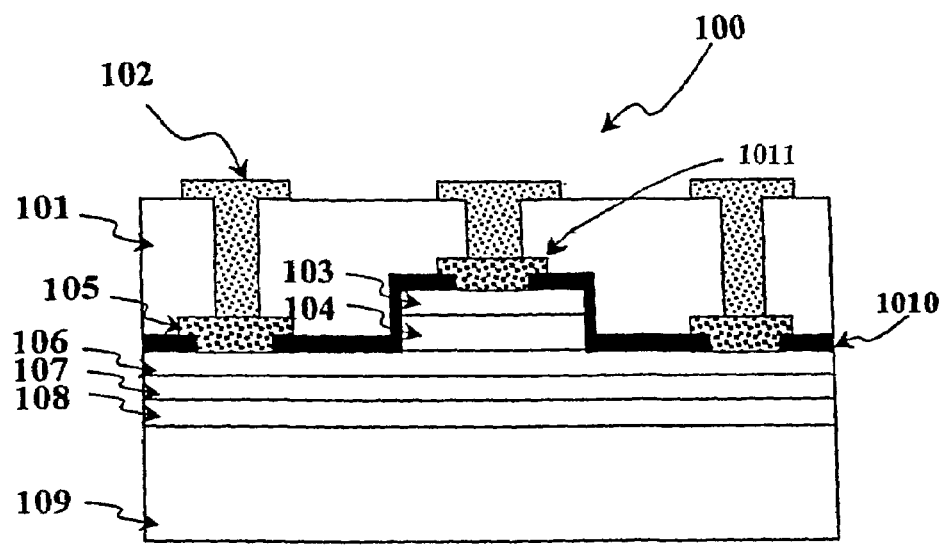
FIG. 9 shows the cross-sectional view of a partially processed semiconductor device suitable for bonding as a flip chip (shown before it is flipped for further processing) in an exemplary embodiment of the present invention.

Referring now to FIGS. 9–13, an exemplary embodiment of a method for manufacturing a semiconductor device, such as a heterojuntion bipolar transistor (HBT) 130 using the anisotropically conductive layer 50, 60, 70 of the present invention is illustrated. FIG. 9 illustrates a partially processed HBT chip 100. The partially processed HBT chip 100 consists of InP substrate 109 and five epitaxially grown layers including a 100 nm thick n+ type InGaAs emitter contact layer 103, an n type InP emitter layer 104, a p+ type InGaAs base layer 106, an n– type InGaAs subcollector layer 107 and an n+ type InGaAs collector layer 108. The emitter layer 104 and the emitter contact layer 103, are etched to form a mesa shape. A $Si_3N_4$ passivation layer 1010 is then formed on the base layer 106 and the mesa layers 103 and 104 using PECVD. The $Si_3N_4$ layer 1010 is then etched to make openings for ohmic contact electrode layers 105 and 1011 for the base and emitter, respectively, which are formed by conventional metallization, photolithography and etching. The surface of the chip 100 is then covered with a layer of insulator material 101, such as a polyamide. Holes are then formed in the layer of insulating material 101 from the top surface to each of the base and emitter ohmic contact electrodes 105 and 1011, using photolithography and anisotropic plasma etching. Electrical contact terminals or pads 102 are formed on the base and emitter ohmic contact electrodes 105 and 1011 using electroplating.

Figure 10:
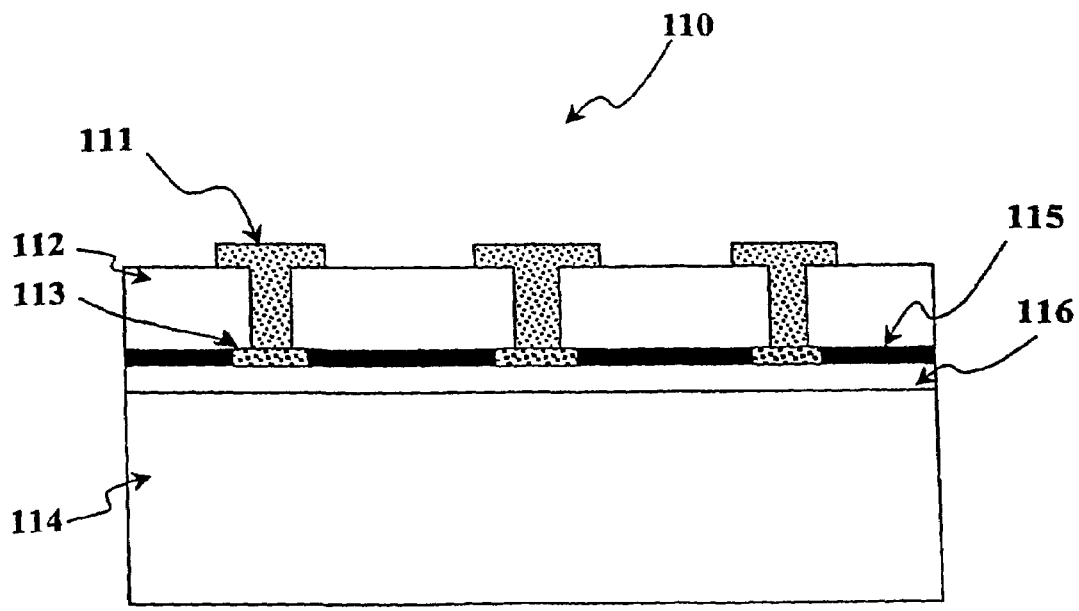
FIG. 10 shows the cross-sectional view of a circuit containing structure suitable for use as a carrier in an exemplary embodiment of the present invention.

FIG. 10 illustrates an electronic circuit containing structure or carrier, 110, having conventional electronic circuits (e.g., integrated circuits) contained in semiconductor layer 116. The semiconductor layer 116 is covered by a layer of $Si_3N_4$, which has openings for contact electrodes 113 to the electronic circuits in the layer 116. A further layer 112, preferably of a polyamide, is formed over the $Si_3N_4$ layer 115 and the contact electrodes 113. Holes are formed in the layer 112 extending from its top surface to respective contact electrodes 113 by conventional photolithography and anisotropic etching, the holes are filled with metal and a contact pad 111 is formed over each hole by electroplating of the contact electrode through each of the holes. In this manner, electrical contact terminals or pads 111 are provided at the surface of layer 112 for electrical connection to the electronic circuits contained in the semiconductor layer 116.

Figure 11:
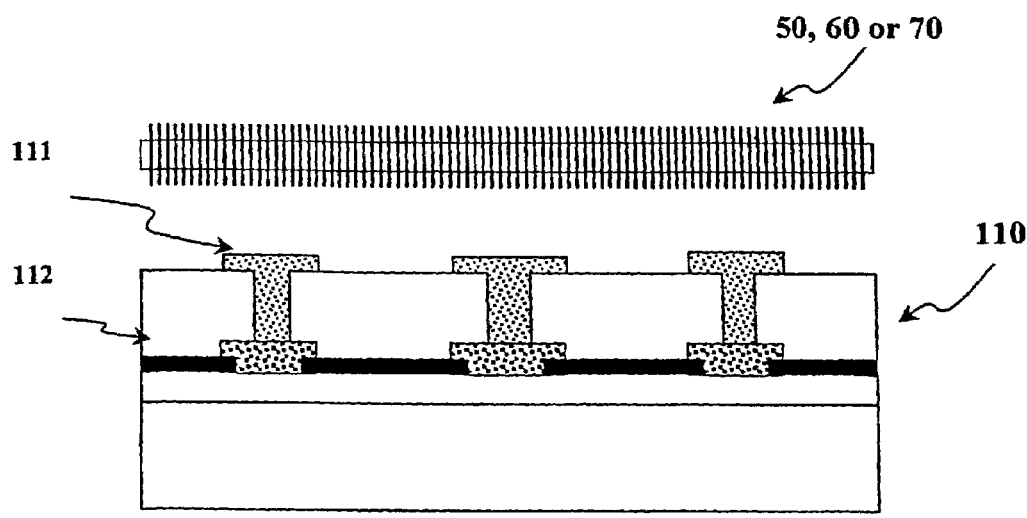
FIG. 11 shows the cross-sectional view of an anisotropically conductive layer disposed above a carrier wafer before bonding on a carrier in an exemplary embodiment of the present invention.

FIG. 11 illustrates the anisotropically conductive layer 50, 60, 70 positioned above the carrier 110 just before bonding thereon. The bonding technique may be any of the methods previously described with reference to FIGS. 7A–7B, 8A–8B. As can be seen, proper alignment between the structure 110 and the anisotropically conductive layer is not necessary as long as electrical contact terminals 111 are in contact with an adequate number of pins of the anisotropically conductive layer 50, 60, 70; however, to ensure maximum mechanical support of the carrier and/or the flip chip, the anisotropically conductive layer 50, 60, 70 should include a sufficient number of pins to cover as much of the interface surface of carrier 110 as possible.

Figure 12:
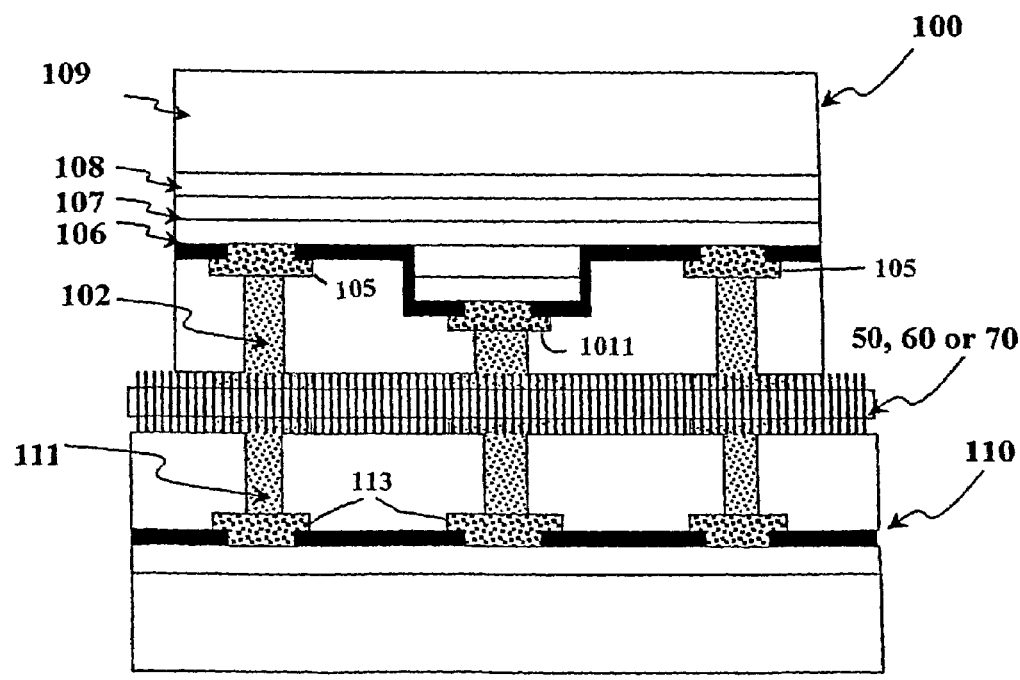
FIG. 12 shows the cross-sectional view of a partially processed semiconductor device chip bonded in a flip chip fashion (shown after flipping) to a carrier using an anisotropically conductive layer in an exemplary embodiment of the present invention.

Referring now to FIGS. 9 and 12, the electrical and mechanical bonding of the carrier 110 and flip chip 100 is shown. Anisotropically conductive layer 50, 60, 70 (previously bonded onto carrier 110) is bonded on its other side to the partially 30 processed HBT chip 100, flipped upside down, using the methods previously described with reference to FIGS. 7A–7B, 8A–8B, forming the structure shown in FIG. 12. At this stage, each contact electrode 113 of the carrier 110, is electrically connected to a respective one of the contact electrodes 105, 1011 of the flip chip 100. As shown in FIG. 12, each contact electrode 113 of the carrier 110 is electrically, connected to the contact electrode 105, 1011 of the partially processed HBT flip chip positioned directly above the respective carrier contact electrode 111. Again, it will be appreciated that precise alignment of the carrier 110 and flip chip is not necessary because the surface of the electrical contact terminals or pads 102, 111, will usually be contacted by more than 10,000 metal pins, thus ensuring electrical connection between the carrier 110 and flip chip 100 despite some misalignment between the two.

Figure 13:
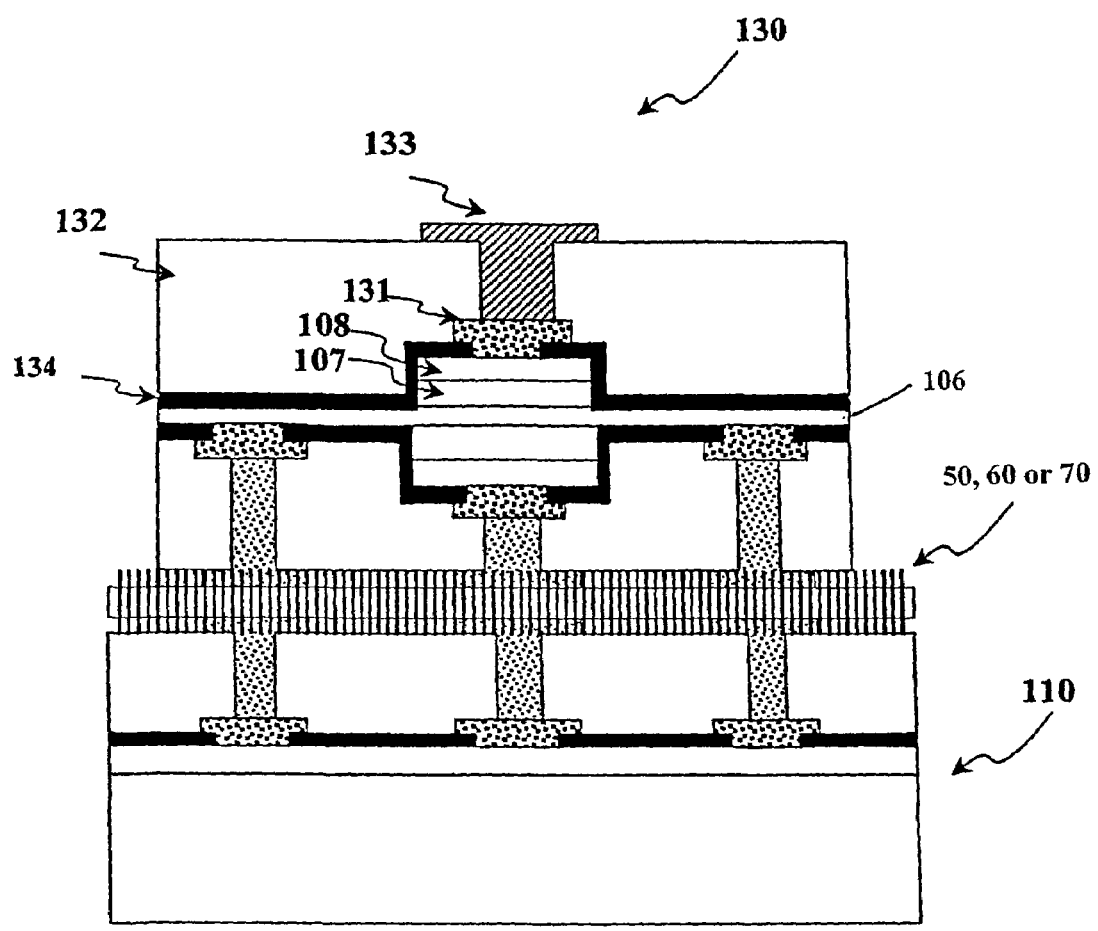
FIG. 13 shows the cross-sectional view of a fully processed semiconductor device chip bonded to a carrier using an anisotropically conductive layer in accordance with an exemplary embodiment of the present invention.

Once the carrier and flip chip have been electrically and mechanically bonded using the anisotropically conductive layer, further processing of the backside of flip chip 100 may take place to form a completed HBT 130 as shown in FIG. 13. In the exemplary embodiment, the further processing includes selective etching away the entire InP substrate 109, etching the collector layer 104 and the collector contact layer 103 to form a collector mesa structure that rises above the base layer 106, forming a $Si_3N_4$ passivation layer 134 covering the base layer 106 and the collector mesa, forming a contact window in the $Si_3N_4$ layer above the collector mesa, forming a collector contact electrode 131 in the contact window by making ohmic contact between the collector contact layer 108 and a deposited metal layer patterned by conventional photolithography and etching, covering the back side of the HBT with a layer of polyamide 132, forming a hole extending from the top surface of the polyamide layer 132 to the collector contact electrode 131 using photolithography and etching, and filling the hole with metal forming a contact pad over the hole by electroplating of the collector contact electrode through the hole. These steps are all familiar to one of ordinary skill in the art.

The foregoing merely illustrates the principles of the invention in exemplary embodiments. Various modifications and alterations to the described embodiments will be apparent to those skilled in the art in view of the teachings herein. For example, the pin density of the anisotropically conductive layer might be varied to produce regions with few pins so as to not interfere with any surface elements of a circuit having non-planar structure. Additionally, the surface of a circuit having non-planar structure may be coated with a hard protective layer to protect it from the possibility of damage caused by the pins of the anisotropic conducive layer. As another example, it may be desirable to introduce structural elements similar to the described electrical contact terminals or pads on a circuit containing structure where the number of electrical contact terminals or pads is low. These introduced structural elements would enhance and more fully distribute the mechanical bonding and support provided by the pins but would not provide electrical connection between the circuit containing structures. It will thus be fully appreciated that those skilled in the art will be able to devise numerous systems and methods which, although not explicitly shown or described, embody the principles of the invention and thus are within the spirit and scope of the invention as defined in the appended claims.

The invention claimed is:

1. A bonding interface for mechanical and electrical bonding of a first electronic device containing structure, having a respective bonding surface with at least one conductive first contact pad adjacent thereto, to a second electronic device containing structure having a respective bonding surface with at least one conductive second contact pad adjacent thereto, the first and second structures being arranged so that the respective bonding surfaces of the first and second structures are in opposing relationship to one another, comprising:
   (a) a rigid insulating substrate having a first and a second planar surface, said first planar surface being parallel to said second planar surface; and
   (b) a multiplicity of rigid electrically conductive pins embedded in said insulating substrate wherein:
      said multiplicity of pins are aligned substantially normal to said first and second planar surfaces of the substrate,
      at least substantially all of said multiplicity of pins protrude from said first and second planar surfaces of the substrate,
      said multiplicity of pins are spaced apart from one another,
      at least substantially all of said multiplicity of pins are each separated from a nearest other one of said multiplicity of pins by no more than about 2 microns,
      said multiplicity of pins are distributed throughout said insulating substrate so that said insulating substrate and the embedded multiplicity of pins bonds said first and second device containing structures by being interposed between the respective bonding surfaces of the structures so that the respective bonding surfaces are at respective ends of the at least substantially all of the multiplicity of pins, each one of the at least one first contact pad overlapping a particular one of the at least one second contact pad is electrically connected to said particular one of the at least one second contact pad by a respective group of a plurality of said at least substantially all of the multiplicity of pins, each pin of the respective group having respective ends thereof electrically and mechanically bonded to the electrically connected ones of the at least one first contact pad and the at least one second contact pad, and
      said multiplicity of pins providing mechanical support to the respective bonding surfaces of the first and second device containing structures without the use of an adhesive.

2. The bonding interface of claim 1, wherein the diameter of the portion of each of said multiplicity of pins protruding from said first planar surface is larger than the diameter of the portion of each of said multiplicity of pins not protruding from said first and second planar surfaces.

3. The bonding interface of claim 1, wherein the diameter of the portion of each of said multiplicity of pins not protruding from said first and second planar surfaces is substantially between 0.01 µm and 0.4 µm.

4. The bonding interface of claim 1, wherein said at least one first contact pad and said at least one second contact pad protrude from respective bonding surfaces and wherein substantially all of each of said multiplicity of pins protrudes from said first and second planar surfaces by a distance greater than or equal to the distance said at least one first contact pad and said at least one second contact pad protrude from said respective bonding surfaces.

5. The bonding interface of claim 1, wherein said multiplicity of pins are substantially evenly distributed throughout said insulating substrate.

6. The bonding interface of claim 5, wherein the average distance between said pins is substantially equal to or less than the thickness of said first electronic device containing structure after the respective bonding surfaces of the first and second electronic device containing structures are bonded to the bonding interface and after any subsequent processing on said first electronic circuit containing substrate.

7. The bonding interface of claim 1, wherein each of said multiplicity of pins protrudes from said first planar surface by a distance substantially the same as the average distance between adjacent ones of said plurality of pins.

8. The bonding interface of claim 1, wherein said rigid insulating substrate is comprised of material selected from the group consisting of: $SiO_2$, SiNx, mica, polycarbonate, SiC and alumina.

9. The bonding interface of claim 1, wherein the distance between said first and second planar surfaces of said rigid insulating substrate is substantially between 5 µm and 25 µm.

10. A method for electrically and mechanically bonding a first electronic device containing structure having a first bonding surface with at least one conductive first contact pad adjacent thereto to a second electronic device containing structure having a second bonding surface with at least one conductive second contact pad adjacent thereto, the first and second structures being arranged so that the respective bonding surfaces of the first and second structures are in opposing relationship to one another, comprising:
   (a) providing a rigid insulating substrate with a first and second planar surface, said first planar surface being parallel to said second planar surface;

(b) embedding a multiplicity of rigid electrically conductive pins in said insulating substrate aligned substantially normal to said first and second planar surfaces, wherein at least substantially all of said multiplicity of pins protrude from said first and second planar surfaces, said multiplicity of pins being spaced apart from one another and wherein at least substantially all of said multiplicity of pins are each separated from a nearest other one of said multiplicity of pins by no more than about 2 microns; and (c) bonding said first and second electronic device containing structures without the use of an adhesive by mechanically and electrically bonding to respective ones of the at least one first contact pad and the at least one second contact pad respective ends of each one of the multiplicity of pins extending from each one of the at least one first contact pad to a particular one of the at least one second contact pad.

11. The method of claim 10, wherein said at least one first contact pad protrudes from the first bonding surface and said at least one second contact pad protrudes from the second bonding surface.

12. The method of claim 11, wherein said bonding step (c) comprises soldering a respective group of a plurality of pins to each overlapping region of each one of the at least one first contact pad overlapping a particular one of the at least one second contact pad, and soldering a respective group of a plurality of pins to each overlapping region of each one of the at least one second contact pad overlapping a particular one of the at least one first contact pad.

13. The method of claim 11, wherein said bonding step (c) comprises causing at least a part of the portion of each of a respective group of a plurality of pins that protrudes from said first planar surface to penetrate each overlapping region of each one of the at least one first contact pad overlapping a particular one of the at least one second contact pad, and causing at least a part of the portion of each of a respective group of a plurality of pins that protrudes from said second planar surface to penetrate each overlapping region of each one of the at least one second contact pad overlapping a particular one of the at least one of the first contact pad.

14. The method of claim 11, further comprising before said bonding step (c), coating the first and second bonding surfaces, except for the at least one first contact pad and the at least one second contact pad, with a relatively soft insulating material having thickness substantially equal to a distance that the at least one first contact pad protrudes from the first bonding surface and a distance that the at least one second contact pad protrudes from the second bonding surface, wherein said bonding step comprises causing at least a part of each of a respective group of a plurality of pins that protrude from the first planar surface to penetrate each overlapping region of each one of the at least one first contact pad overlapping a particular one of the at least one second contact pad, and causing at least a part of the portion of each of a respective group of a plurality of pins that protrude from the second planar surface to penetrate each overlapping region of each one of the at least one second contact pad overlapping a particular one of the at least one of the first contact pad, and for each pin that does not penetrate the at least one first contact pad or the at least one second pad, causing at least parts of respective portions that extend beyond the first and second planar surfaces to penetrate the relatively soft insulating material on the first and second bonding surfaces.

15. A method of making a semiconductor device, the method comprising:

(a) providing a semiconductor substrate having a plurality of layers formed on a first surface thereof;

(b) forming at least one first electrical contact pad on at least one of said layers;

(c) providing an electronic circuit containing carrier having an interface surface with at least one second electrical contact pad adjacent thereto;

(d) providing a rigid insulating substrate with a first and a second planar surface, said first planar surface being parallel to said second planar surface; and (e) embedding a multiplicity of rigid electrically conductive pins in said insulating substrate aligned substantially normal to said first and second planar surfaces, each of said multiplicity of pins having a first and second end, wherein at least substantially all of said multiplicity of pins protrude from said first and second planar surfaces by respective fixed amounts, said multiplicity of pins being spaced apart from one another, and each one of at least substantially all of said multiplicity of pins being separated from a nearest other one of said multiplicity of pins by no more than about 2 microns;

(f) arranging the semiconductor substrate, the electronic circuit containing carrier, the insulating substrate and the embedded multiplicity of pins so that the at least one first electrical contact pad and the interface surface are in opposing relationship to one another, and the insulating substrate and embedded multiplicity of pins are disposed therebetween;

(g) bonding the at least one first electrical contact pad on the at least one of said layers to the first ends of a respective first group of the multiplicity of pins without the use of an adhesive;

(h) electrically and mechanically bonding the at least one second electrical contact pad to the second ends of a respective second group of the multiplicity of pins without the use of an adhesive, each respective first group of the multiplicity of pins having at least a plurality of pins in common with each respective second group of the multiplicity of pins so as to electrically connect each one of the at least one first electrical contact pad with a respective one of the at least one second electrical contact pad;

(i) after said bonding steps (g) and (h), carrying out a at least one processing step on a second surface of said semiconductor substrate having the plurality of layers formed thereon; and (j) forming at least one third electrical contact pad adjacent to said second surface of said semiconductor substrate facing away from said multiplicity of pins.

16. The method of claim 15, wherein said semiconductor device is a high-speed heterojunction bipolar transistor.

* * * * *